(12) United States Patent
Matsuo

(10) Patent No.: US 11,251,773 B2
(45) Date of Patent: Feb. 15, 2022

(54) AT-CUT CRYSTAL ELEMENT, CRYSTAL UNIT, AND SEMI-MANUFACTURED CRYSTAL UNIT

(71) Applicant: NIHON DEMPA KOGYO CO., LTD., Tokyo (JP)

(72) Inventor: Kiyoharu Matsuo, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 258 days.

(21) Appl. No.: 16/709,925

(22) Filed: Dec. 11, 2019

(65) Prior Publication Data

US 2020/0195224 A1   Jun. 18, 2020

(30) Foreign Application Priority Data

Dec. 13, 2018   (JP) .............................. JP2018-233189
Oct. 9, 2019   (JP) .............................. JP2019-185791

(51) Int. Cl.
*H03H 9/19*   (2006.01)
(52) U.S. Cl.
CPC ..................................... *H03H 9/19* (2013.01)
(58) Field of Classification Search
CPC ........ H03H 9/19; H03H 9/0509; H03H 9/177; H03H 9/02157
See application file for complete search history.

(56) References Cited

U.S. PATENT DOCUMENTS

2019/0267964 A1\* 8/2019 Yumura ................... H03B 5/32

FOREIGN PATENT DOCUMENTS

| JP | 2001144578 | 5/2001 |
|---|---|---|
| JP | 2016034061 | 3/2016 |

\* cited by examiner

*Primary Examiner* — Jeffrey M Shin
(74) *Attorney, Agent, or Firm* — JCIPRNET

(57) ABSTRACT

An AT-cut crystal element includes a vibrator and a supporting portion. The vibrator has a planar shape with an approximately rectangular shape. The supporting portion is connected to one short side of the vibrator and has a thickness thicker than a thickness of the vibrator. The AT-cut crystal element has an oscillation frequency of approximately 76 Mhz. The vibrator has a distal end portion that is an end portion on a side opposite to the supporting portion. The distal end portion is formed to have a protrusion shape toward a distal end side thereof. The vibrator has both ends formed to have a protrusion shape toward an outside direction along the short side. The vibrator has a long side dimension L and a short side dimension W. A W/L is in a range of 0.74 to 0.79 or in a range of 0.81 to 0.93.

11 Claims, 8 Drawing Sheets

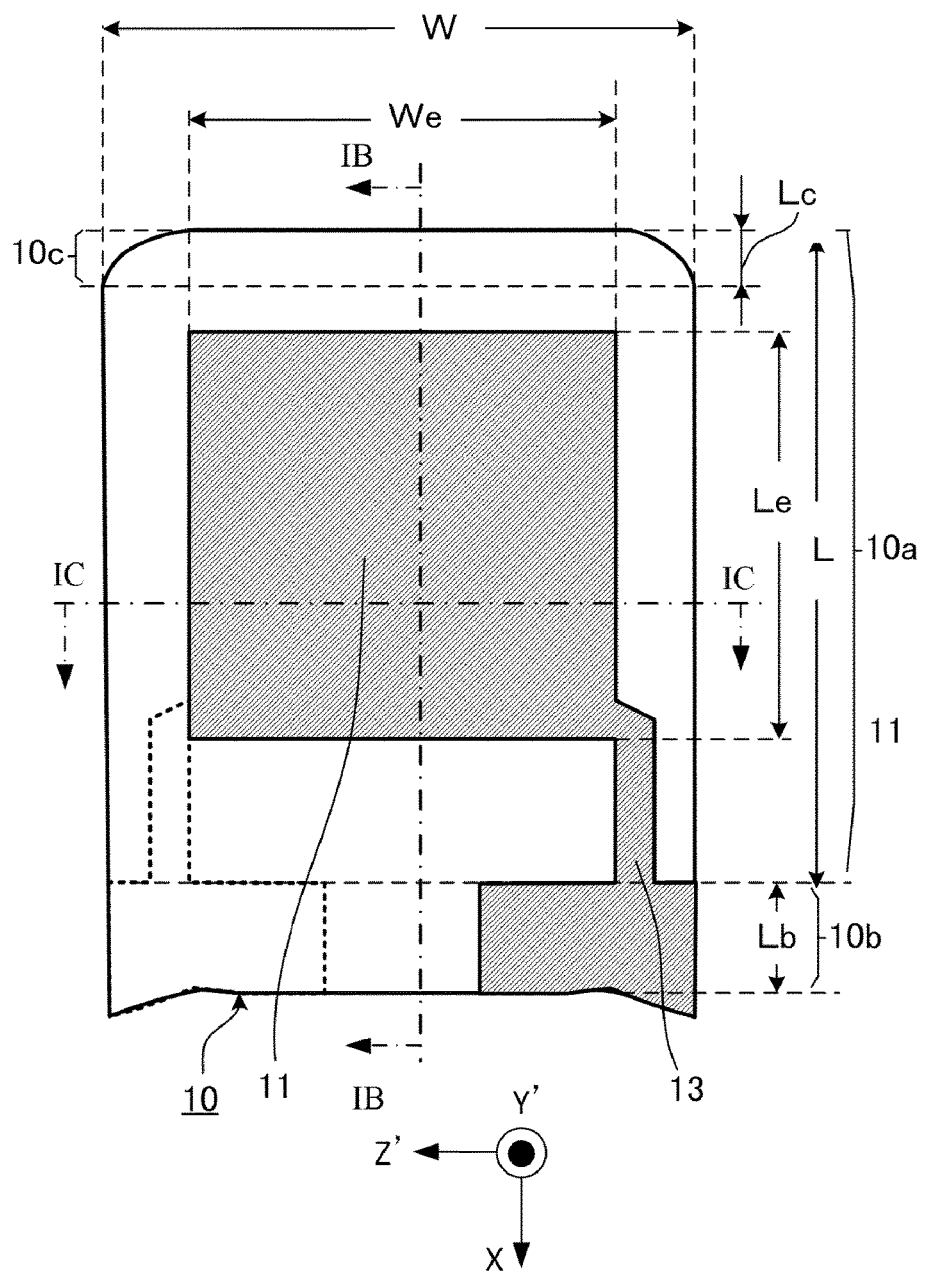
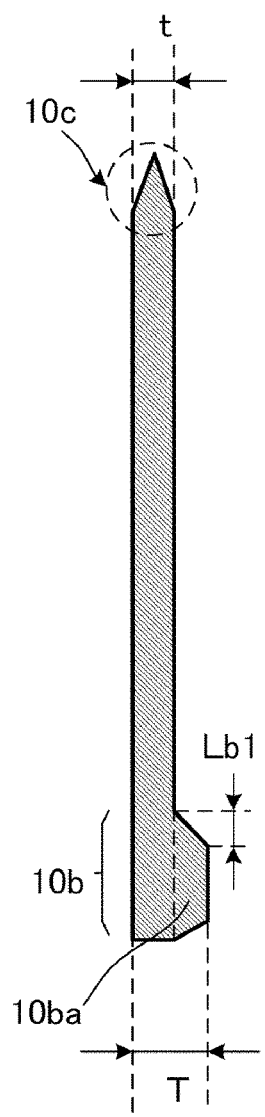
FIG. 1A
FIG. 1B
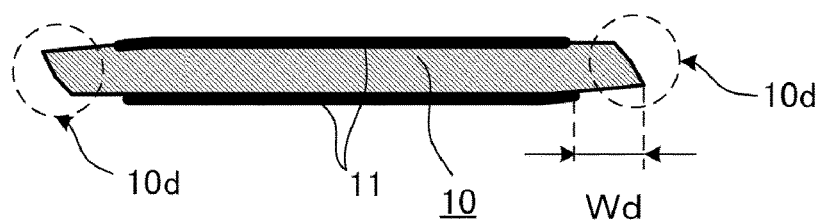
FIG. 1C

AT-CUT CRYSTAL ELEMENT, CRYSTAL UNIT, AND SEMI-MANUFACTURED CRYSTAL UNIT

CROSS-REFERENCE TO RELATED APPLICATIONS

This application claims the priority benefits of Japan Patent Application No. 2018-233189, filed on Dec. 13, 2018 and Japan Patent Application No. 2019-185791, filed on Oct. 9, 2019. The entirety of the above-mentioned patent applications is hereby incorporated by reference herein and made a part of this specification.

TECHNICAL FIELD

The disclosure relates to a crystal element that includes a supporting portion having a thickness thicker than a thickness of a vibrator, a crystal unit including this crystal element, and a semi-manufactured crystal unit for this crystal unit.

DESCRIPTION OF THE RELATED ART

As one kind of a crystal unit, there is a crystal unit that includes a crystal element including a supporting portion having a thickness thicker than a thickness of a vibrator. Its specific examples are disclosed in, for example, Japanese Unexamined Patent Application Publication No. 2001-144578 and Japanese Unexamined Patent Application Publication No. 2016-34061.

The crystal unit disclosed in Japanese Unexamined Patent Application Publication No. 2001-144578 includes a crystal element that includes a vibrator and a supporting portion that is connected to one end of this vibrator and is thicker than the vibrator. Connecting and fixing the supporting portion to a container of the crystal unit with a conductive member configures the crystal unit. Even when the vibrator is thin in this crystal unit, the supporting portion counteracts a stress from the container of the crystal unit. This avoids a frequency variation of the vibrator (for example, Paragraph 33 in Japanese Unexamined Patent Application Publication No. 2001-144578).

The crystal unit disclosed in Japanese Unexamined Patent Application Publication No. 2016-34061 includes a crystal element. The crystal element includes: a vibrator having one end on which a fixing portion (corresponding to the supporting portion) thicker than the vibrator is disposed; and a buffer portion disposed between the vibrator and the fixing portion. This buffer portion is an inclined portion having a thickness that increases toward the fixing portion side from the vibrator (for example, claim 1 in Japanese Unexamined Patent Application Publication No. 2016-34061). This crystal unit includes the buffer portion, thus ensuring attenuating vibrations of the vibrator and avoiding an influence on the vibrator from the fixing portion (for example, Paragraph 8 in Japanese Unexamined Patent Application Publication No. 2016-34061).

Japanese Unexamined Patent Application Publication No. 2016-34061 describes specific dimensions of the crystal element as follows. The vibrator has a long side dimension of 0.98 mm, a short side dimension of 0.78 mm, and a thickness of 13 µm. The supporting portion has a long side dimension of 0.79 mm, a short side dimension of 0.35 mm, and a thickness of 50 µm. Moreover, in plan view of a top surface of the crystal element, a length from the vibrator to the fixing portion is 0.05 mm (for example, Paragraph 26 in Japanese Unexamined Patent Application Publication No. 2016-34061). In the case of including this crystal element, the thickness of 13 µm provides a crystal unit having around an oscillation frequency of 128 Mhz. While a crystal unit having a conventional structure without including a thick fixing portion has a crystal impedance (hereinafter referred to as CI) of 50 to 100Ω, this crystal unit ensures having the improved CI of 20 to 50Ω (for example, Paragraph 26 in Japanese Unexamined Patent Application Publication No. 2016-34061).

However, Japanese Unexamined Patent Application Publication No. 2016-34061 neither describes nor suggests a preferred configuration of the crystal element used in the crystal unit having the oscillation frequency of around 76 Mhz.

A need thus exists for an AT-cut crystal element, a crystal unit, and a semi-manufactured crystal unit which are not susceptible to the drawback mentioned above.

SUMMARY

According to an aspect of this disclosure, there is provided an AT-cut crystal element that includes a vibrator and a supporting portion. The vibrator has a planar shape with an approximately rectangular shape. The supporting portion is connected to one short side of the vibrator. The supporting portion has a thickness thicker than a thickness of the vibrator. The AT-cut crystal element has an oscillation frequency of approximately 76 Mhz. The vibrator has a distal end portion that is an end portion on a side opposite to the supporting portion. The distal end portion is formed to have a protrusion shape toward a distal end side thereof. The vibrator has both ends along the short side. Both the ends are formed to have a protrusion shape toward an outside direction along the short side. The vibrator has a long side dimension L and a short side dimension W. A W/L that is a ratio of the short side dimension W to the long side dimension L is in a range of 0.74 to 0.79 or in a range of 0.81 to 0.93.

BRIEF DESCRIPTION OF THE DRAWINGS

The foregoing and additional features and characteristics of this disclosure will become more apparent from the following detailed description considered with reference to the accompanying drawings, wherein:

FIG. 1A to FIG. 1C are explanatory drawings of a crystal element 10 of an embodiment;

DETAILED DESCRIPTION

Figure 2:
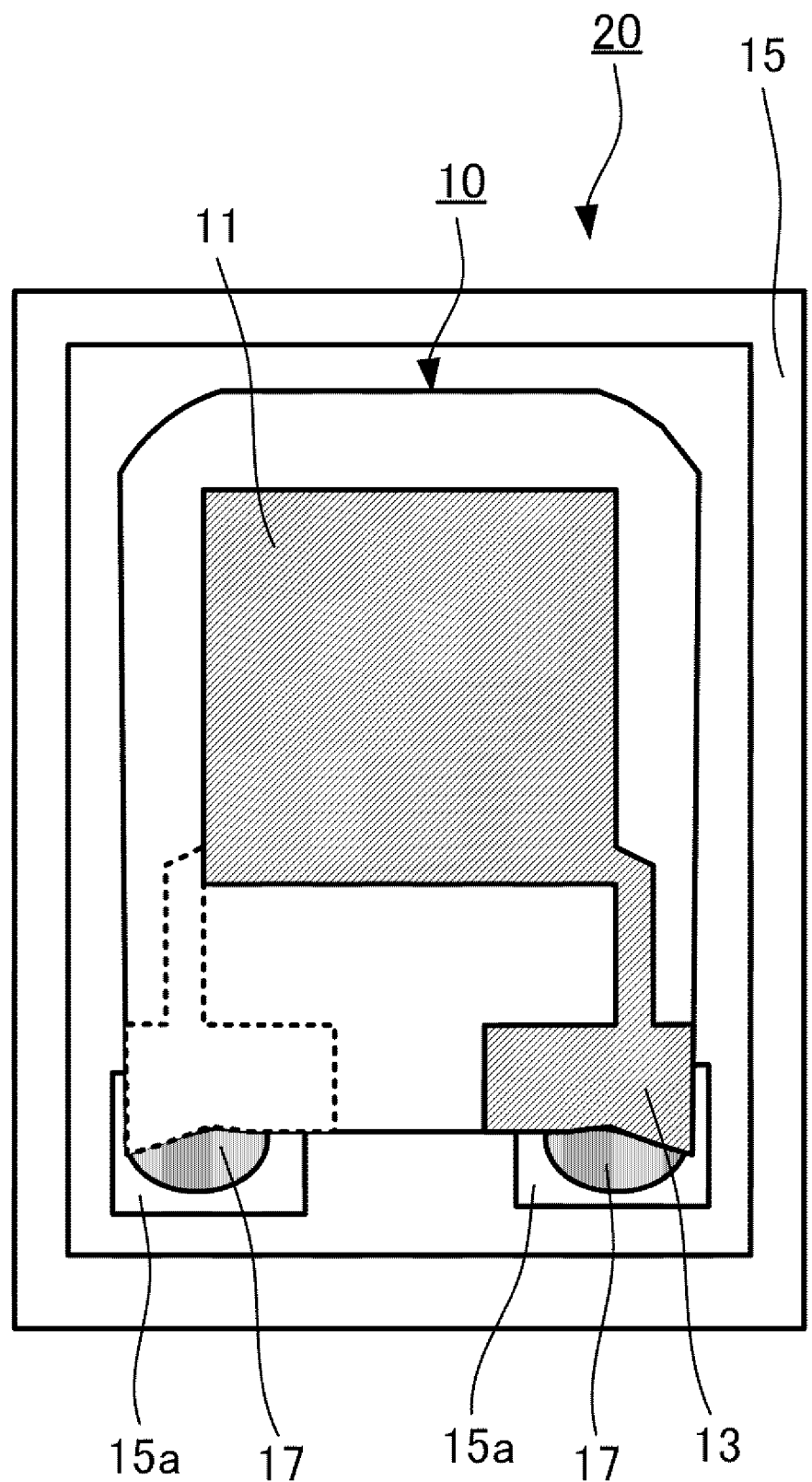
FIG. 2 is a plan view of a crystal unit 20 using the crystal element 10.

The following describes an embodiment of a crystal element and a crystal unit and a semi-manufactured crystal unit according to the disclosure with reference to the drawings. Each drawing used in the descriptions is merely illustrated schematically for understanding the disclosure. In each drawing used in the descriptions, like reference numerals designate corresponding or identical elements, and therefore such elements will not be further elaborated here in some cases. Shapes, dimensions, materials, and similar factor described in the following embodiment are merely preferable examples within the scope of the disclosure. Therefore, the disclosure is not limited to only the following embodiment.

[1. Structure of Crystal Unit]

FIG. 1A to FIG. 1C are explanatory drawings of a crystal element 10 included in a crystal unit of the embodiment. Especially, FIG. 1A is a plan view of the crystal element 10, FIG. 1B is a sectional drawing taken along the line IB-IB line in FIG. 1A, and FIG. 1C is a sectional drawing taken along the line IC-IC line in FIG. 1A. Here, a configuration where the crystal element 10 includes excitation electrodes 11 and extraction electrodes 13, namely, a state of one embodiment of the crystal unit is illustrated.

Coordinate axes X, Y', and Z' illustrated in FIG. 1A are respective crystallographic axes of a crystal in the AT-cut crystal element 10. Note that, the AT-cut crystal element itself is described in, for example, a document: "Handbook of Quartz Crystal Device" (Fourth Edition, page 7 or other pages, published by Quartz Crystal Industry Association of Japan, March 2002) in detail. Therefore, the explanation will be omitted here.

The crystal element 10 of this embodiment includes a vibrator 10a, a supporting portion 10b that is connected to a side of one short side of the vibrator 10a, and predetermined protrusion shapes 10c and 10d. Furthermore, the crystal element 10 includes the excitation electrodes 11 and the extraction electrodes 13 that are disposed on front and back principal surfaces of the vibrator 10a. The following describes the respective components in detail and a relationship among the respective components.

The vibrator 10a has a planar shape with an approximately rectangular shape, and the distal end portion 10c, which is an end portion on a side opposite to the supporting portion 10b, is formed to have the protrusion shape 10c toward its distal end side (see FIG. 1B). A part of this protrusion shape 10c is hereinafter referred to as the first protrusion-shaped portion 10c.

Furthermore, the vibrator 10a having both the ends 10d along the short side of the vibrator 10a is formed to have the protrusion shapes 10d toward an outside direction along the short side (see FIG. 1C). A part of this protrusion shape 10d is hereinafter referred to as the second protrusion-shaped portion 10d. When it is assumed that the vibrator 10a has a long side dimension as L and a short side dimension as W, a W/L, which is a ratio of the short side dimension W to the long side dimension L, is in a range of 0.74 to 0.79 or in a range of 0.81 to 0.93. This respect will be described in a section of "2. Experiments and Their Results," which is described later.

Here, the first protrusion-shaped portion 10c as the protrusion shape 10c specifically has a shape where a thickness of the vibrator 10a gradually becomes thin from t toward its distal end. That is, when a cross-sectional surface formed by cutting the vibrator 10a along an X-axis of the crystal is viewed, the first protrusion-shaped portion 10c has a plurality of surfaces and has a shape with a protrusion shape toward a −X-side.

The number of surfaces that constitute the cross-sectional surface of this first protrusion-shaped portion 10c formed by cutting along the X-axis of the crystal can be any number corresponding to a design of the crystal element 10. Specifically, the number of surfaces can be controlled in accordance with wet etching conditions when the crystal element 10 is manufactured. However, typically, the number of surfaces is preferably two to six surfaces, and more preferably two surfaces or three surfaces. This is because they are effective for reducing unnecessary vibrations.

The second protrusion-shaped portion 10d as the protrusion shape 10d specifically has a shape where the thickness of the vibrator 10a gradually becomes thin on both ends along a Z'-axis of the crystal from t toward an outside along the Z'-axis. That is, when a cross-sectional surface formed by cutting the vibrator 10a along the Z'-axis of the crystal is viewed, the second protrusion-shaped portion 10d has a plurality of surfaces and has a shape with a protrusion shape toward the outside along the Z'-axis.

The number of surfaces that constitute the cross-sectional surface of this second protrusion-shaped portion 10d formed by cutting along the Z'-axis of the crystal can be any number corresponding to the design of the crystal element 10. Specifically, for example, the number of surfaces can be controlled in accordance with wet etching conditions when the crystal element 10 is manufactured. However, typically, the number of surfaces is two to six surfaces, preferably two surfaces or three surfaces, and more preferably three surfaces. This is because they are effective for reducing unnecessary vibrations.

The supporting portion 10b is connected to the one short side of the vibrator 10a and has a thickness T thicker than the thickness t of the vibrator 10a. In the case of this example, one surface of the supporting portion 10b is flush with one surface of the vibrator 10a (see FIG. 1B). Then, the supporting portion 10b has the other surface opposed to the one surface, and the other surface has a plateau-shaped part 10ba protruding outside along a Y'-axis. Therefore, this plateau-shaped part 10ba has a thickness of (T−t).

In the case of this embodiment, the plateau-shaped part 10ba has a thickness that gradually decreases toward the vibrator 10a side to be connected to the vibrator 10a. That is, the plateau-shaped part 10ba has a structure having an inclined portion. It is assumed that this plateau-shaped part 10ba has a dimension along the X-axis of the crystal as Lb1 (details will be described below).

The respective excitation electrodes 11 are disposed on both the principal surfaces of the vibrator 10a. These excitation electrodes 11, which are disposed on both the principal surfaces of the vibrator 10a, are arranged to be mutually opposed. The extraction electrodes 13 are extracted from the respective excitation electrodes 11 to the supporting portion 10b side. These respective excitation electrodes 11 and extraction electrodes 13 can be formed of a laminated film of, for example, a chrome and a gold formed on the chrome.

This crystal element 10 is mounted in a predetermined container to be sealed. FIG. 2 is a plan view illustrating its typical example. That is, the crystal element 10 is adhesively fixed into, for example, a well-known ceramic package 15 at a position of the extraction electrode 13 by, for example, a silicone conductive adhesive 17. Furthermore, this ceramic package 15 is sealed in a sealing state of vacuum, an inert gas atmosphere, or similar atmosphere with a predetermined lid member (not illustrated), thus configuring a crystal unit 20. The ceramic package 15 has a structure including a depressed portion that houses the crystal element 10 and may be a container having a configuration where the lid member is joined to a dike part of a periphery of this depressed portion, or a container that includes a ceramic substrate, which is a flat plate, and a cap-shaped lid member. The configuration of the container may be various.

[2. Experiments and Their Results]
[2-1. Experiments Regarding Aspect Ratio of Vibrator]

First, the following describes experiments of obtaining an aspect ratio of the vibrator described in the disclosure and their results. As prototype crystal units, various crystal units based on the conditions described in the following were prototyped.

As a design matter thought to be important based on, for example, a past design experience, the long side dimension L of the vibrator 10a, and the short side dimension W of the vibrator 10a were variously changed to prototype the crystal units in a plurality of levels.

The respective crystal units in the plurality of these levels were configured to have common design values other than the above-described design values as follows. First, it was assumed that the vibrator 10a included the first protrusion-shaped portion 10c having a dimension Lc of 0.04 mm, and the second protrusion-shaped portion 10d having a dimension Wd of 0.18 mm. It was also assumed that the excitation electrode 11 had a dimension Le of 0.5 mm along the X-axis of the crystal, and a dimension We of 0.4 mm along the Z'-axis of the crystal. Note that the excitation electrode 11 was formed to have the center point displaced by 20 μm to the distal end side of the crystal along the X-axis of the crystal with respect to the center point of the crystal element 10. Furthermore, it was assumed that the vibrator 10a had the thickness t of approximately 0.018 mm as a standard. Note that, actually, this thickness t is a thickness configured such that an oscillation frequency of this crystal element 10 including a mass of the excitation electrodes 11 becomes approximately 76.8 Mhz.

Thus, the above-described Lc, Wd, Le, We, and displaced amount of the electrode are conditions that can be indicated as, for example, Lc/L, Lc/W, Wd/L, Wd/W, Le/L, Le/W, We/L, and We/W, with respect to, for example, the long side dimension L or the short side dimension W of the vibrator 10a. A denominator when such a normalization is performed is not limited to a long side dimension and may be another dimension, such as the thickness t of the vibrator 10a. It was assumed that the supporting portion 10b had a short side dimension, that is, a dimension Lb of 0.13 mm along the X-axis of the crystal in this case, and the supporting portion 10b had a part that was inclined on the vibrator 10a side and had a dimension Lb1 (see FIG. 1B) of 0.04 mm. Then, it was assumed that the thickness T of the supporting portion 10b was 0.05 mm. Therefore, Lb, Lb1, and T are also predetermined conditions that can be indicated by a ratio using any dimension as the denominator, such as Lb/L, Lb/W, Lb1/L, Lb1/W, T/L, and T/W, with respect to, for example, the long side dimension L or the short side dimension W of the vibrator 10a.

Figure 3A:
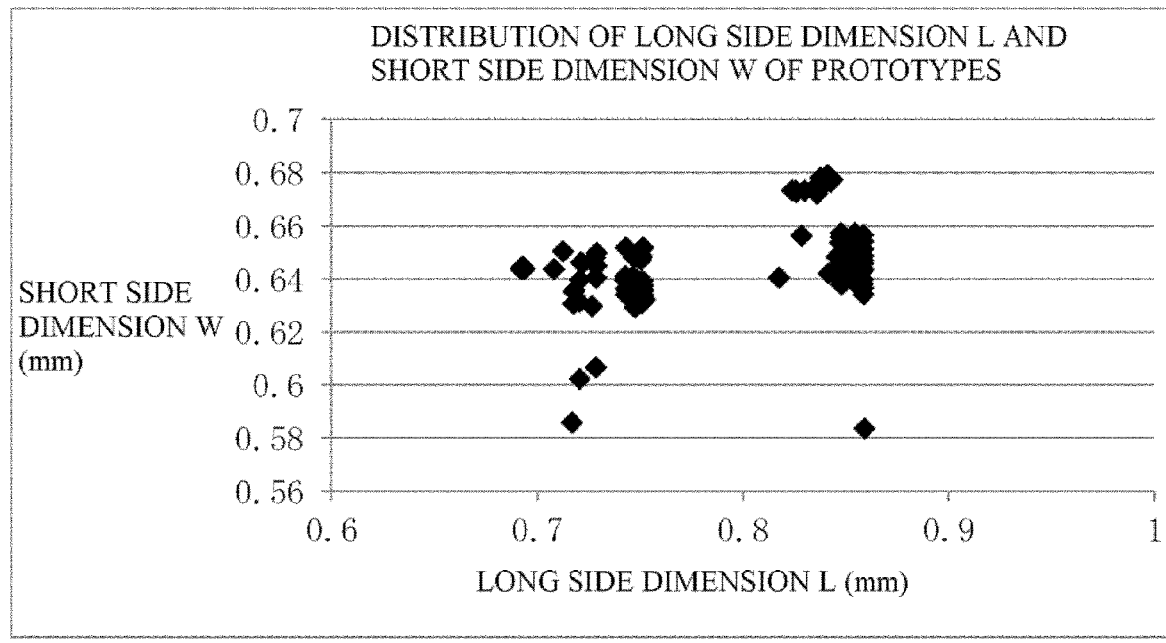
FIG. 3A and FIG. 3B are explanatory drawings of experiments and their results.

FIG. 3A illustrates a distribution focused on the long side dimension L and the short side dimension W of many prototypes produced by variously changing the long side dimension L of the vibrator 10a and the short side dimension W of the vibrator 10a. That is, the respective points plotted in FIG. 3A denote crystal units having different combinations of the long side dimension L and the short side dimension W. Specifically, for example, the crystal unit corresponding to the plot point on the leftmost side along a horizontal axis in FIG. 3A denotes a crystal unit having the long side dimension L of 0.69 mm and the short side dimension W of 0.642 mm, that is, a crystal unit having an aspect ratio W/L of 0.642/0.69 equal to 0.930. Note that many prototyped crystal units had the actual long side dimensions L of vibrators in a range of 0.693 to 0.859 mm and the actual short side dimensions W of the vibrators in a range of 0.585 to 0.677 mm.

The crystal unit prototyped on the basis of the above-described conditions was mounted in the container 15 described using FIG. 2 and was vacuum-sealed to manufacture a prototype crystal unit. Next, various magnitudes of currents were flowed to these crystal units, so as to measure a frequency and a crystal impedance (CI) of the crystal unit at a time of each of the currents. That is, a drive level characteristic was measured. Then, in the drive level characteristics of the respective crystal units, a difference between a frequency at a time of 10 μW and a frequency at a time of 400 μW was calculated, and this difference was divided by an oscillation frequency to calculate a frequency change rate ΔF (unit: ppm). Subsequently, in order to examine a relationship between the aspect ratio W/L of the vibrator and the above-described ΔF, the horizontal axis denotes the aspect ratio W/L, a vertical axis denotes the ΔF, and data of the prototype crystal units was plotted.

Figure 3B:
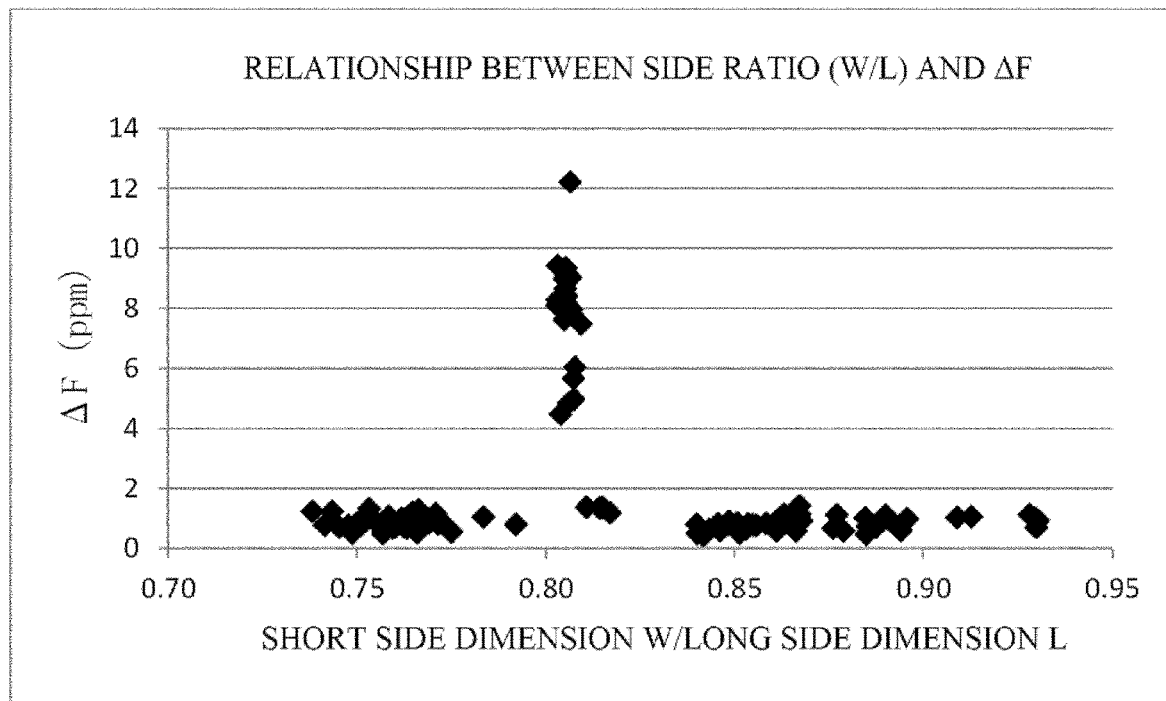

FIG. 3B is a diagram of the above-described plots. According to FIG. 3B, when the aspect ratio W/L of the vibrator is around 0.80, a value of ΔF increases. In contrast to this, when the aspect ratio W/L of the vibrator is in the range of 0.74 to 0.79 or the aspect ratio W/L of the vibrator is in the range of 0.81 to 0.93, the ΔF is small and within 2 ppm, and thus it is found that, what is called, a satisfactory crystal unit having a small drive level dependence is obtained. Thus, it is found that when the crystal element includes the supporting portion 10b thicker than the vibrator 10a, and the vibrator 10a including the predetermined first protrusion-shaped portion 10c and second protrusion-shaped portion 10d, the aspect ratio W/L of the vibrator is preferably in the range of 0.74 to 0.79 or the aspect ratio W/L of the vibrator is preferably in the range of 0.81 to 0.93.

[2-2. Experiments Regarding Ratio of X-Dimension of Excitation Electrode to X-Dimension of Vibrator]

Next, a preferred range of a dimension Le of the excitation electrode 11 along the X-axis of the crystal was examined through experiments. In the case of the AT-cut crystal unit, a characteristic of the crystal unit varies depending on a dimension as an X-dimension Le of the excitation electrode with respect to a dimension (here, an X-dimension L of the vibrator illustrated in FIG. 1A) of the vibrator along the X-axis of the crystal. Thus, a preferred dimension of the X-dimension Le of the excitation electrode was searched. In view of this, the crystal element had fixed dimensions of the X-dimension L of 0.690 mm and a Z'-dimension W of 0.630 mm within the above-described preferred range of the aspect ratio of the vibrator. The excitation electrode had a fixed dimension of the Z'-dimension We of 0.4 mm. The X-dimension Le of the excitation electrode was changed to have a plurality of levels in a range of 0.43 to 0.54 mm, and a plurality of kinds of crystal elements were prototyped. Then, using these crystal elements, a plurality of kinds of crystal units were prototyped. Subsequently, using, for example, a measurement method similar to the above-described experiment regarding the aspect ratio of the vibrator, the CI and the drive level characteristic of the plurality of kinds of crystal units having different X-dimension Le of the excitation electrode were measured, and further, the frequency change rate was calculated.

Figure 4A:
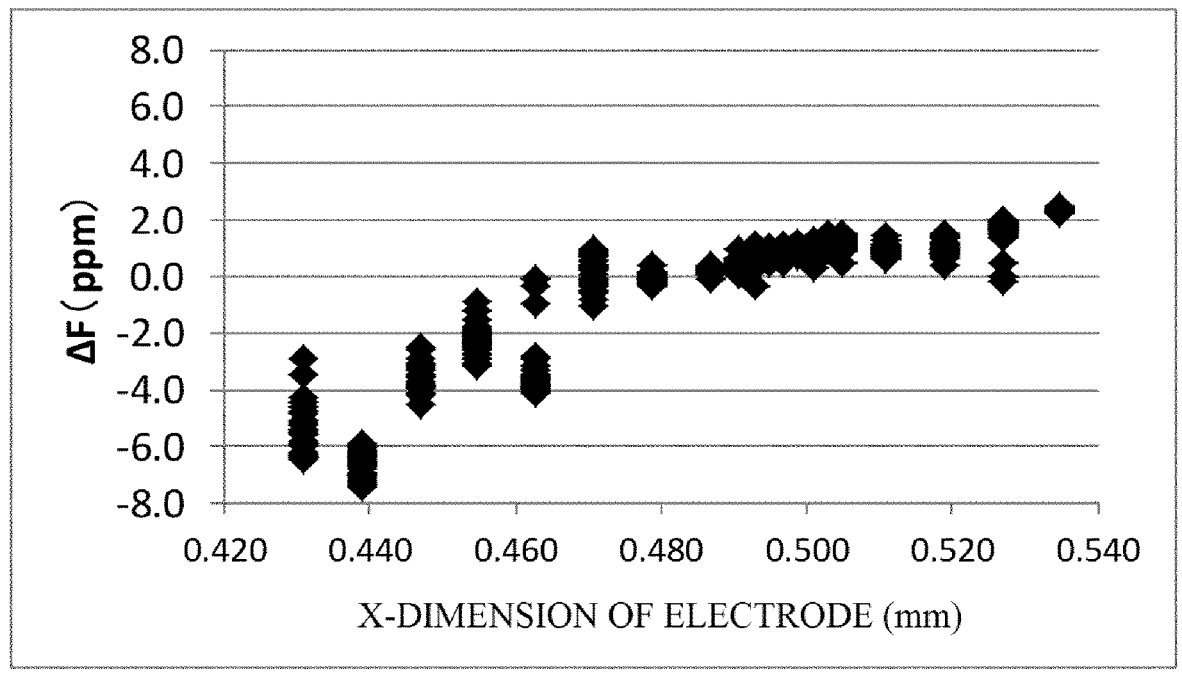
FIG. 4A, FIG. 4B, and FIG. 4C are explanatory drawings describing the experiments and their results following FIG. 3A and FIG. 3B.
Figure 4B:
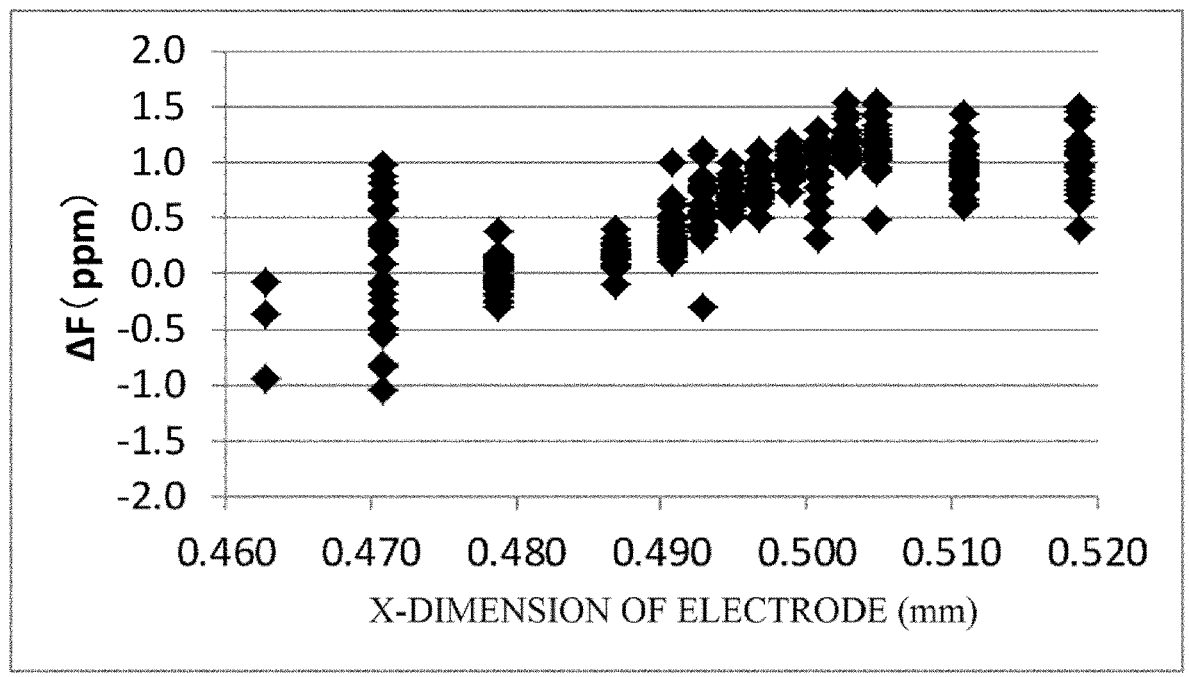
Figure 4C:
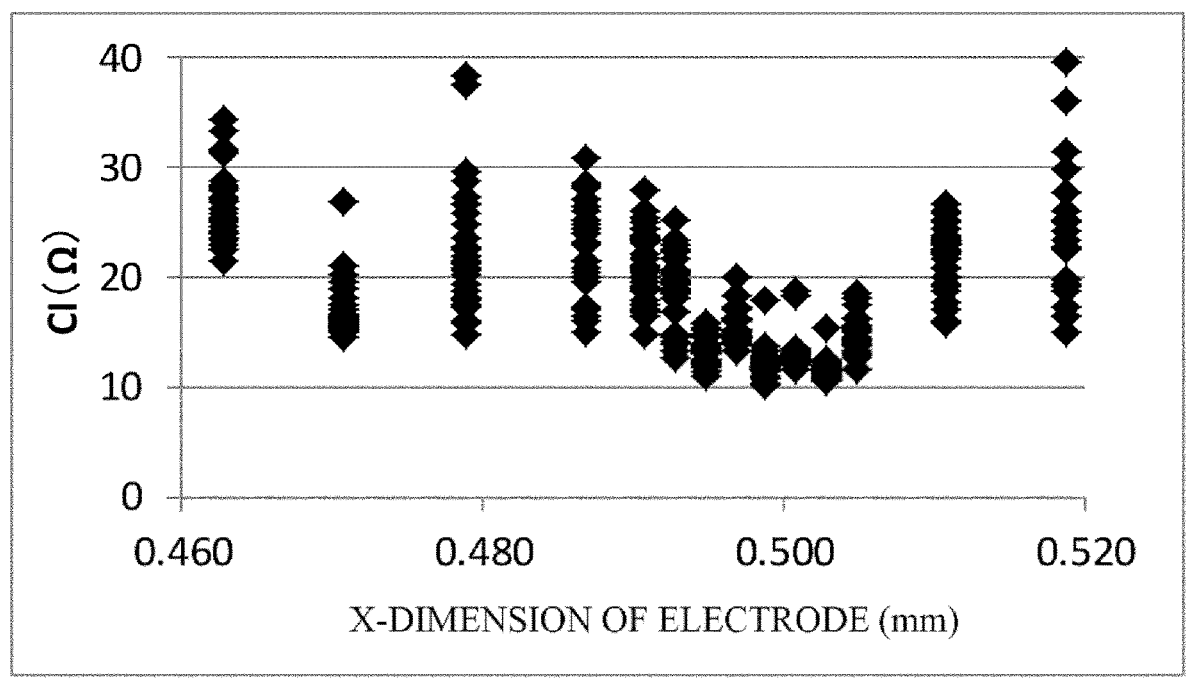

FIG. 4A is a diagram where the above-described experimental results are plotted while a horizontal axis denotes the X-dimension (mm) of the excitation electrode, and a vertical axis denotes the frequency change rate ΔF (ppm). FIG. 4B is a diagram where a region of 0.46 to 0.52 of the X-dimension in FIG. 4A is enlarged. The characteristic significantly varies when the X-dimension is in a range of 0.46 to 0.52. Therefore, the region is intended to be easily seen. FIG. 4C is a diagram where the above-described experimental results are plotted while a horizontal axis denotes the X-dimension (mm) of the excitation electrode, and a vertical axis denotes the CI (a). Note that, similarly to FIG. 4B, FIG. 4C is focused on the X-dimension of the excitation electrode in a plot region of 0.46 to 0.52. The CI means respective CI values of the respective prototypes at room temperature.

In FIG. 4A and FIG. 4B, the closer to zero the $\Delta F$ is, the more preferred it is. In FIG. 4C, the smaller the CI is, the more preferred it is. Therefore, according to FIG. 4A and FIG. 4B, the X-dimension Le of the excitation electrode that ensures the $\Delta F$ to be, for example, ±3 ppm as a specification of the $\Delta F$ of the crystal unit is 0.450 to 0.540 mm. The X-dimension Le of the excitation electrode that ensures the $\Delta F$ to be ±1.5 ppm is 0.470 to 0.520 mm. The X-dimension Le of the excitation electrode that ensures the $\Delta F$ to be ±1 ppm is 0.490 to 0.500 mm. It is found that when these ranges are normalized with the X-dimension L of 0.69 mm in the vibrator in this experiment, an Le/L that ensures the $\Delta F$ to be ±3 ppm is 0.45/0.69 to 0.54/0.69 nearly equal to 0.652 to 0.782, the Le/L that ensures the $\Delta F$ to be ±1.5 ppm is 0.681 to 0.754, and the Le/L that ensures the $\Delta F$ to be ±1 ppm is 0.710 to 0.725.

Examining a point where the CI is improved, according to FIG. 4C, it is found as follows: the X-dimension Le of the excitation electrode that ensures the CI to be, for example, 30Ω or less, for example, as a specification of the CI of the crystal unit is 0.480 to 0.510 mm; the X-dimension Le of the excitation electrode that ensures CI to be 25Ω or less is 0.490 to 0.510 mm; and the X-dimension Le of the excitation electrode that ensures the CI to be 20Ω or less is 0.495 to 0.510 mm. It is found that when these ranges are normalized with the X-dimension L of 0.69 mm in the vibrator in this experiment, the Le/L that ensures the CI to be 30Ω or less is 0.48/0.69 to 0.51/0.69 nearly equal to 0.696 to 0.739, the Le/L that ensures the CI to be 25Ω or less is 0.710 to 0.739, and the Le/L that ensures the CI to be 20Ω or less is 0.717 to 0.739. Then, as the Le/L that can satisfy both the $\Delta F$ and the CI, examining a point that improving the CI can be prioritized, the Le/L is preferably Le/L equal to 0.696 to 0.739 that ensures the CI to be 30Ω or less, more preferably the Le/L equal to 0.710 to 0.739 that ensures the CI to be 25Ω or less, and further preferably the Le/L equal to 0.717 to 0.739 that ensures the CI to be 20Ω or less.

Thus, when the disclosure is performed, it is preferred that the excitation electrode is designed such that the ratio of the X-dimension Le of the excitation electrode to the X-dimension L of the vibrator is in the above-described preferred range. In the case of the crystal unit, even when the frequency is changed, or a size of the crystal element is changed, each of a satisfactory range of the aspect ratio of the vibrator and a satisfactory range of the ratio of the X-dimension of the excitation electrode to the X-dimension of the vibrator can be often diverted to each design of the crystal element and the excitation electrode. Thus, it is considered that the above-described preferred range of the disclosure is applicable to other than the crystal unit of the above-described embodiment.

[3. Description of Exemplary Manufacturing Method]

In order to deepen understanding of the disclosure, with reference to FIG. 5 to FIG. 7, the following describes an exemplary manufacturing method of the crystal element 10. A large number of the above-described crystal elements 10 can be manufactured from a quartz-crystal wafer using a photolithography technology and a wet etching technique. Thus, a part of the following drawings used for the description of the exemplary manufacturing method includes a plan view of a quartz-crystal wafer 10w and plan views where a part M of the quartz-crystal wafer 10w is enlarged.

Figure 5A:
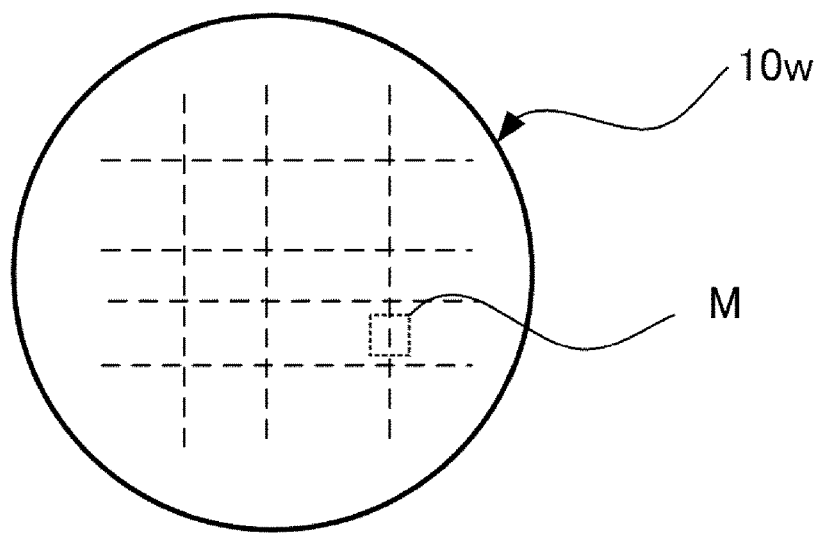
FIG. 5A and FIG. 5B are explanatory drawings of an exemplary manufacturing method of the crystal element 10.

First, the quartz-crystal wafer 10w is prepared (see FIG. 5A). While the oscillation frequency of the AT-cut crystal element 10 is, as well known, almost determined by the thickness of the principal surface (X-Z' surface) part of the crystal element 10, in the case of the disclosure, since the supporting portion has a thickness thicker than that of the vibrator, the quartz-crystal wafer 10w to be prepared is a wafer thicker than a final thickness of the vibrator.

Figure 5B:
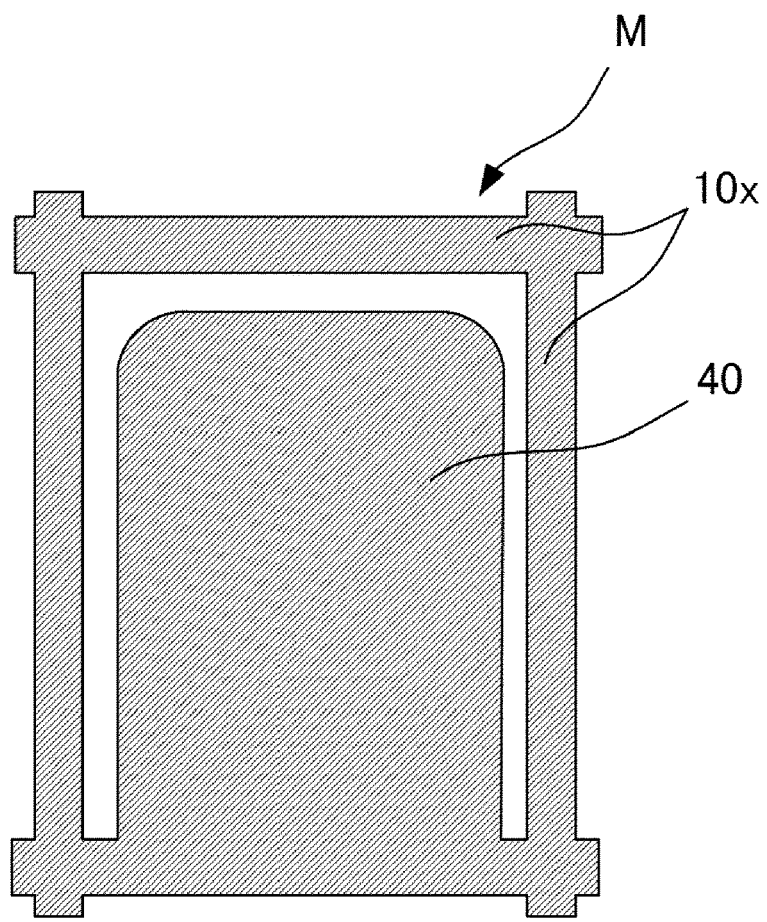

Next, the well-known film forming technique and photolithography technique are used to form wet etching resist masks 40, which are masks to form an outer shape of the crystal element, on both front and back surfaces of the quartz-crystal wafer 10w (see FIG. 5B). The wet etching resist masks 40 according to the embodiment include a part corresponding to the outer shape of the crystal element and have a shape covering a frame part 10x that holds each crystal element.

Figure 6A:
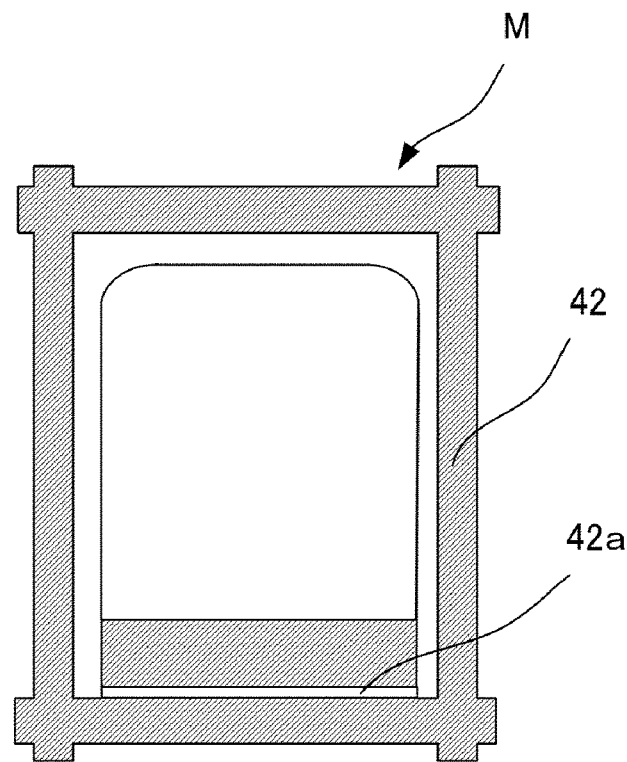
FIG. 6A and FIG. 6B are explanatory drawings of the exemplary manufacturing method of the crystal element 10 following FIG. 4A to FIG. 4C.

Next, the quartz-crystal wafer 10w on which the wet etching resist masks 40 have been formed is dipped in a wet etching solution for a predetermined period. This forms the outer shape of the crystal element. Subsequently, on the front and back of the wafer on which the above-described formation of the outer shape has been terminated, vibrator formation masks 42 are formed to have a part corresponding to the vibrator that is exposed (FIG. 6A). Note that the vibrator formation mask 42 has an elongated opening 42a between the frame part 10x and the supporting portion (see 10b in FIG. 1A and FIG. 1B). The opening 42a is formed such that while an etchant can enter the opening 42a, the opening 42a does not pass through the quartz-crystal wafer 10w. This reason is that a depressed portion as a folding-and-taking starting point when the crystal element is individualized from the frame part 10x is formed.

Figure 6B:
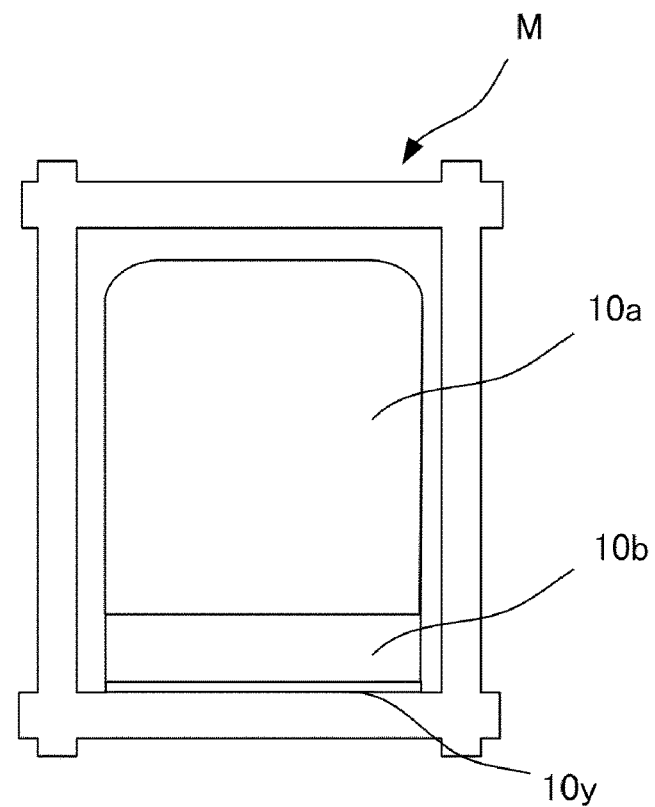

Subsequently, the quartz-crystal wafer 10w on which the vibrator formation mask 42 have been formed is dipped in a wet etching solution for a predetermined period. Then, the vibrator formation mask 42 are removed. This forms the vibrator 10a, the supporting portion 10b, and a folding-and-taking starting point portion 10y (FIG. 6B).

Figure 7A:
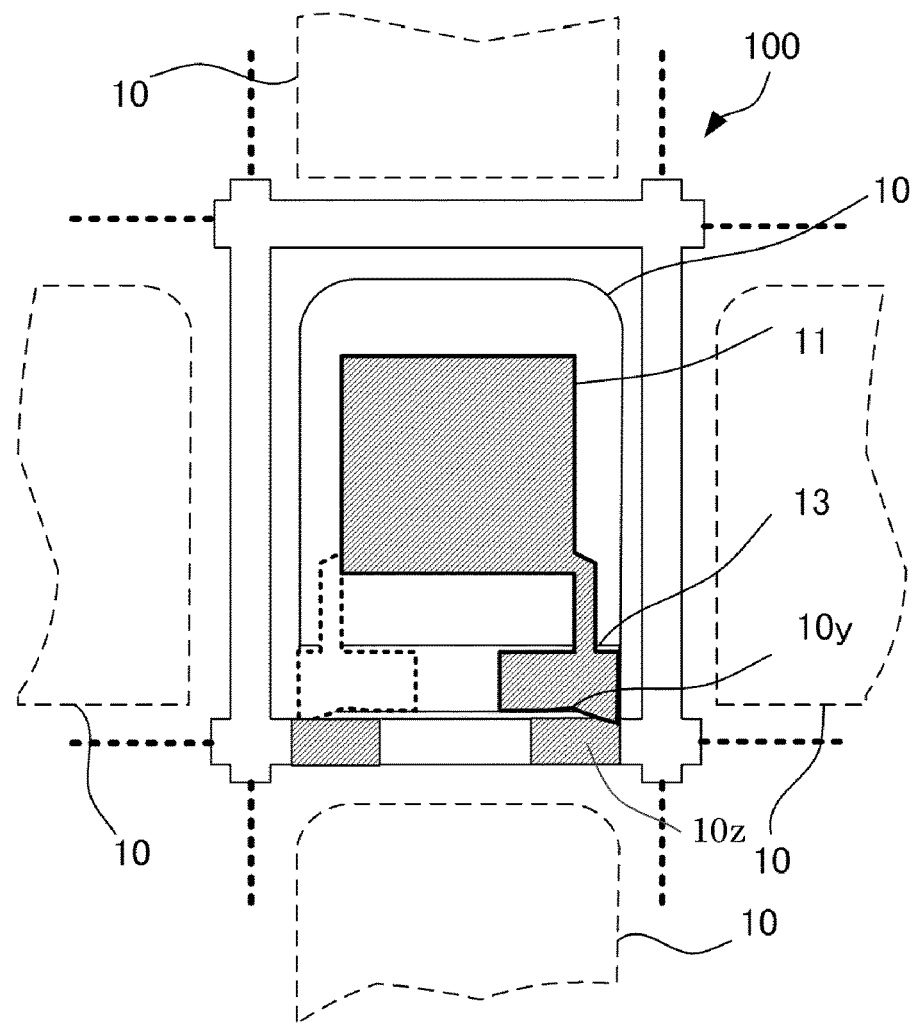
FIG. 7A and FIG. 7B are explanatory drawings of the exemplary manufacturing method of the crystal element 10 following FIG. 5A and FIG. 5B.
Figure 7B:
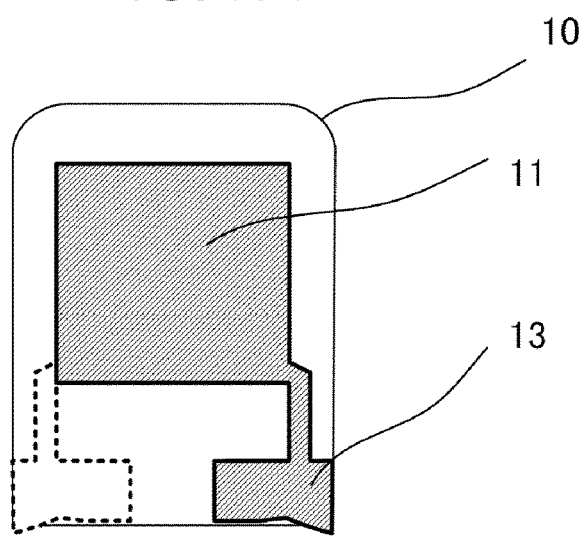

Next, the known film forming technique and photolithography technology are used to form the excitation electrodes 11 and the extraction electrodes 13 (see FIG. 7A). Thus, a semi-manufactured crystal unit 100 including a large number of the crystal elements of the disclosure is obtained. At this time, in order to ensure performing a characteristic inspection of the crystal unit in a wafer state, inspection electrode pads 10z are formed in the frame part 10x. Subsequently, for example, an electrical characteristic inspection in the wafer state is performed as necessary. Subsequently, an appropriate force is applied to an appropriate portion of the crystal element 10 to preform folding and taking, and the crystal element 10 is folded and taken from the frame part 10x using the folding-and-taking starting point portion 10y (see FIG. 7B). Even in a state of the intermediate 100, a commercial transaction may be performed.

The crystal unit of the disclosure is a crystal unit that includes the crystal element of the disclosure, excitation electrodes disposed on front and back of the crystal element, and extraction electrodes extracted from the excitation electrodes. The crystal unit of the disclosure is a crystal unit that includes the crystal element of the disclosure, excitation electrodes disposed on front and back of the crystal element, extraction electrodes extracted from the excitation electrodes, and a container that houses the crystal unit. The semi-manufactured crystal unit of the disclosure is a semi-manufactured crystal unit that includes a wafer including a large number of crystal units in a matrix. The crystal unit includes the crystal element of the disclosure, excitation electrodes disposed on front and back of the crystal element, and extraction electrodes extracted from the excitation electrodes.

Here, in the above-described disclosure, the approximately rectangular shape means including a regular rectangular shape that has four corners having right angles and a rectangular shape slightly deformed from the regular rectangular in a scope of the object of the disclosure. For example, this also means including an approximately rectangular shape where, for example, the corner portion on the distal end side of the vibrator has a slightly rounded shape. The oscillation frequency of approximately 76 Mhz means including 76.8 Mhz and an oscillation frequency there-around, such as 74 to 78 Mhz.

With the crystal element according to the embodiment, the crystal element includes the supporting portion having the thickness thicker than that of the vibrator and has a cantilever supporting structure. The crystal element has the above-described predetermined end surface shapes and aspect ratio. Therefore, in addition to the effect by the supporting portion, the predetermined end surface shapes and predetermined aspect ratio ensure the more attenuated unnecessary vibrations. These ensure achieving the crystal element having the oscillation frequency of approximately 76 Mhz and an excellent characteristic.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal element that is an AT-cut crystal element, comprising:
  a vibrator that has a planar shape with an approximately rectangular shape; and
  a supporting portion connected to one short side of the vibrator, the supporting portion having a thickness thicker than a thickness of the vibrator,
  wherein
  the AT-cut crystal element has an oscillation frequency of approximately 76 Mhz, and
  the vibrator has a distal end portion that is an end portion on a side opposite to the supporting portion, the distal end portion being formed to have a protrusion shape toward a distal end side of the distal end portion,
  the vibrator having both ends along the short side, the both ends being formed to have a protrusion shape toward an outside direction along the short side,
  the vibrator having a long side dimension L and a short side dimension W,
  a W/L that is a ratio of the short side dimension W to the long side dimension L being in a range of 0.74 to 0.79 or in a range of 0.81 to 0.93.

2. The crystal element according to claim 1, wherein the oscillation frequency is 76.8 Mhz.

3. A crystal unit, comprising:
  the crystal element according to claim 1;
  excitation electrodes, respectively disposed on a front surface and a back surface of the crystal element; and
  extraction electrodes, being extracted from the excitation electrodes.

4. A crystal unit, comprising:
  the crystal element according to claim 1;
  excitation electrodes, respectively disposed on a front surface and a back surface of the crystal element;
  extraction electrodes, being extracted from the excitation electrodes; and
  a container that houses the crystal element, the excitation electrodes, and the extraction electrodes.

5. The crystal unit according to claim 3, wherein
  each of the excitation electrodes has a planar shape with a rectangular shape, and
  an Le/L that is a ratio of a long side dimension Le of each of the excitation electrodes to a long side dimension L of the vibrator has a value in a range of 0.696 to 0.739.

6. The crystal unit according to claim 3, wherein
  each of the excitation electrodes has a planar shape with a rectangular shape, and
  an Le/L that is a ratio of a long side dimension Le of each of the excitation electrodes to a long side dimension L of the vibrator has a value in a range of 0.710 to 0.739.

7. The crystal unit according to claim 3, wherein
  each of the excitation electrodes has a planar shape with a rectangular shape, and
  an Le/L that is a ratio of a long side dimension Le of each of the excitation electrodes to a long side dimension L of the vibrator has a value in a range of 0.717 to 0.739.

8. A semi-manufactured crystal unit, comprising a wafer including a large count of crystal units in a matrix, wherein the crystal unit includes:
  the crystal element according to claim 1;
  excitation electrodes, respectively disposed on a front surface and a back surface of the crystal element; and
  extraction electrodes, being extracted from the excitation electrodes.

9. The semi-manufactured crystal unit according to claim 8, wherein
  each of the excitation electrodes has a planar shape with a rectangular shape, and
  an Le/L that is a ratio of a long side dimension Le of each of the excitation electrodes to a long side dimension L of the vibrator has a value in a range of 0.696 to 0.739.

10. The semi-manufactured crystal unit according to claim 8, wherein
  each of the excitation electrode has a planar shape with a rectangular shape, and
  an Le/L that is a ratio of a long side dimension Le of each of the excitation electrodes to a long side dimension L of the vibrator has a value in a range of 0.710 to 0.739.

11. The semi-manufactured crystal unit according to claim 8, wherein
  each of the excitation electrodes has a planar shape with a rectangular shape, and
  an Le/L that is a ratio of a long side dimension Le of each of the excitation electrodes to a long side dimension L of the vibrator has a value in a range of 0.717 to 0.739.

* * * * *